United States Patent
Ho et al.

(10) Patent No.: US 6,410,429 B1
(45) Date of Patent: Jun. 25, 2002

(54) METHOD FOR FABRICATING VOID-FREE EPITAXIAL-$CoSi_2$ WITH ULTRA-SHALLOW JUNCTIONS

(75) Inventors: Chaw Sing Ho, Singapore (SG); Kheng Chok Tee, Port Klane (MY); Kin Leong Pey, Singapore (SG); G. Karunasiri, Singapore (SG); Soo Jin Chua, Singapore (SG); Kong Hean Lee, Singapore (SG); Alex Kalhung See, Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/795,113

(22) Filed: Mar. 1, 2001

(51) Int. Cl.$^7$ ............................................. H01L 21/44
(52) U.S. Cl. ..................... 438/655; 438/656; 438/660; 438/663; 438/664; 438/683
(58) Field of Search ................ 438/655, 656, 438/660, 663, 664, 683

(56) References Cited

U.S. PATENT DOCUMENTS

| | | | |
|---|---|---|---|
| 5,047,367 A | 9/1991 | Wei et al. | 437/200 |
| 5,194,405 A | 3/1993 | Sumi et al. | 437/200 |
| 5,449,642 A | 9/1995 | Tam et al. | 437/200 |
| 5,536,684 A | 7/1996 | Dass et al. | 437/201 |
| 5,567,652 A | 10/1996 | Nishio | 437/200 |
| 5,728,625 A | 3/1998 | Tung | 438/586 |
| 5,731,239 A | * 3/1998 | Wong et al. | |
| 5,766,997 A | * 6/1998 | Takeuchi | |
| 5,924,010 A | * 7/1999 | Chen et al. | |
| 5,970,370 A | 10/1999 | Besser et al. | 438/586 |

* cited by examiner

Primary Examiner—Long Pham
(74) Attorney, Agent, or Firm—George O. Saile; Rosemary L. S. Pike; William J. Stuffel

(57) ABSTRACT

A method for forming a void-free epitaxial cobalt silicide ($CoSi_2$) layer on an ultra-shallow source/drain junction. A patterned silicon structure is cleaned using HF. A first titanium layer, a cobalt layer, and a second titanium layer are successively formed on the patterned silicon substrate. The patterned silicon substrate is annealed at a temperature of between about 550° C. and 580° C. in a nitrogen ambient at atmospheric pressure; whereby the cobalt migrates downward and reacts with the silicon structure to form a $CoSi_2$/CoSi layer, and the first titanium layer migrates upward and the first titanium layer and the second titanium layer react with the nitrogen ambient to form TiN. The TiN and unreacted cobalt are removed. The silicon structure is annealed at a temperature of between about 825° C. and 875° C. to convert the $CoSi_2$/CoSi layer to a $CoSi_2$ layer. The $CoSi_2$ layer can optionally be implanted with impurity ions which are subsequently diffused to form ultra-shallow junctions.

15 Claims, 3 Drawing Sheets

METHOD FOR FABRICATING VOID-FREE EPITAXIAL-COSI$_2$ WITH ULTRA-SHALLOW JUNCTIONS

BACKGROUND

1. Field of the Invention

This invention relates generally to semiconductor fabrication, and more particularly to a method for forming a void-free epitaxial CoSi$_2$ layer which is compatible with ultra-shallow source/drain junctions.

2. Description of Prior Art

Self-aligned silicide (salicide) processes are widely used in semiconductor gate and source/drain structures to reduce sheet resistance. As the gate length of transistors are scaled down for each new generation of integrated circuits (IC) in order to achieve higher speeds and higher density, the source/drain junction depths are also scaled down to reduce the short channel effects. Reduced junction depth can significantly increase the sheet resistance for the source/drain regions. For example, for an 800 angstrom junction depth, a salicide process which consumes 300 angstroms of silicon would reduce the junction thickness by more than a third.

Typically salicide processes use titanium silicide. However, as line widths continue to decrease, titanium silicide becomes impractical. This is because titanium silicide sheet resistance increases dramatically as line widths decrease to about 0.17 microns. Cobalt silicide does not exhibit this line width dependance for sheet resistance, making it an attractive alternative to titanium silicide.

Several method for forming a CoSi$_2$ layer on a shallow source/drain junction have been proposed. In one method, titanium-mediated epitaxy (TIME), a Co/Ti/Si scheme is used. Titanium is deposited onto a silicon structure, preferably by sputtering. Cobalt is deposited onto the titanium, also preferably by sputtering. The substrate is exposed to a two-step anneal in a nitrogen containing ambient, wherein the cobalt and titanium diffuse through one another. The cobalt reacts with the silicon to form CoSi/Co/Si$_2$ and the titanium migrates to the surface and reacts with the nitrogen to form TiN. This process also removes native oxides through a reaction with the titanium to form TiO. The oxygen is released into the chamber ambient when the titanium reacts with the nitrogen.

Another method for forming CoSi$_2$ is oxide-mediated epitaxy (OME), which uses a chemical oxide interfacial layer with multiple deposit-and-ultra-high vacuum (UHV) anneal scheme on an initial CoSi$_2$ layer. However, the UHV in this process increasing fabrication time, reducing throughput. While both methods have demonstrated good epitaxial CoSi$_2$ on flat (blanket) substrates, voids can occur on patterned substrates in high-stress areas such as adjacent to STI structures.

The importance of overcoming the various deficiencies noted above is evidenced by the extensive technological development directed to the subject, as documented by the relevant patent and technical literature. The closest, and apparently more relevant technical developments in the patent literature can be gleaned by considering the following patents.

U.S. Pat. No. 5,047,367 Wei et al. shows a TIME process wherein the epitaxial CoSi$_2$ layer is formed by forming a TiN/CoSi bi-layer, using TiN as a diffusion barrier and as a contact via fill. The titanium layer removes native oxide by reacting with the SiO$_2$ to form titanium oxide (TiO$_x$) which travels to the surface and releases the oxygen to the ambient, and titanium silicide (Ti$_5$Si$_3$ and TiSi$_2$) remains at the silicon interface. However, Wei does not disclose how the TiN diffusion barrier during annealing will survive the subsequent wet etch step. Also, Wei does not disclose or suggest a void formation issue or a method for preventing void formation in his CoSi$_2$ scheme.

U.S. Pat. No. 5,194,405 Sumi et al. shows an OME process for the manufacturing of a semiconductor device using a metal silicide film.

U.S. Pat. No. 5,449,642 Tan et al. shows an OME method of forming a metal_disilicide (MSi$_2$) film.

U.S. Pat. No. 5,728,625 Tung shows an OME process for device fabrication forming an epitaxal CoSi$_2$ layer.

U.S. Pat. No. 5,536,684 Dass et al. shows an OME process designed to form a planar epitaxial CoSi$_2$ layer.

U.S. Pat. No. 5,970,370 Besser et al. shows an unmediated process to form the CoSi$_2$ layer using a Si/Co/TiN/Ti stack and a 2 step RTA. Detrimental contaminations between the silicon and cobalt are prevented by sputter depositing the cobalt layer and the TiN and Ti capping layers in a vacuum.

U.S. Pat. No. 5,567,652 Nishio shows an OME process to form a CoSi$_2$ layer using Si/SiO$_x$/Ti/Co stack and a 2 step RTA.

SUMMARY OF THE INVENTION

It is an object of the present invention to provide a method of fabricating a void-free epitaxial CoSi$_2$ layer on a patterned silicon structure.

It is another object of the present invention to provide a method of fabricating a void-free epitaxial CoSi$_2$ layer which is compatible with an ultra-shallow junction.

It is another object of the present invention to provide a method of fabricating an ultra-shallow junction by a diffusion process, using a void-free epitaxial CoSi$_2$ layer as a dopant source.

It is yet another object of the present invention to provide a method of fabricating an ultra-thin (i.e., $\leq 250$ angstroms) CoSi$_2$ layer suitable for integration into future sub-0.1 micron CMOS architecture.

To achieve these and other objectives, the present invention provides a method for forming a void-free epitaxial cobalt silicide (CoSi$_2$) layer on an ultra-shallow source/drain junction. A patterned silicon structure is cleaned using HF. A first titanium layer, a cobalt layer, and a second titanium layer are successively formed on the patterned silicon substrate. The patterned silicon substrate is annealed at a temperature of between about 550° C. and 580° C. in a nitrogen ambient at atmospheric pressure; whereby the cobalt migrates downward and reacts with the silicon structure to form a CoSi layer, and the first titanium layer migrates upward and the first titanium layer and the second titanium layer react with the nitrogen ambient to form TiN. The TiN and unreacted cobalt are removed. The silicon structure is annealed at a temperature of between about 825° C. and 875° C. to convert the CoSi layer to a CoSi$_2$ layer. The CoSi$_2$ layer can optionally be implanted with dopant ions which are subsequently diffused to form ultra-shallow junctions.

The present invention provides significant advantages over the prior art. Most significantly, the present invention provides a method for forming a CoSi2 layer which is void free due to reduced stress during annealing, by providing improved control over CoSi/CoSi2 thickness at the silicon interface. Also, the CoSi2 layer formed according to the present invention can be injected with dopant ions and used as a dopant source in a diffusion process to form ultra-shallow junctions with minimal silicon damage.

BRIEF DESCRIPTION OF THE DRAWINGS

The features and advantages of a semiconductor device fabricated according to the present invention and further details of a process for fabricating such a semiconductor device in accordance with the present invention will be more clearly understood from the following description taken in conjunction with the accompanying drawings, in which like reference numerals designate similar or corresponding elements, regions, and portions, and in which.

DETAILED DESCRIPTION OF THE INVENTION

The present invention will be described in detail with reference to the accompanying drawings. The present invention provides a method for forming an epitaxial cobalt silicide ($CoSi_2$) layer on an ultra-shallow source/drain junction.

Figure 1:
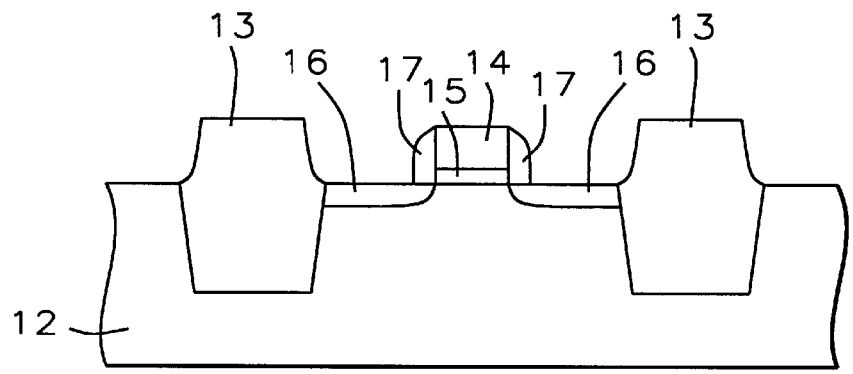
FIGS. 1–4 illustrate sequential sectional views of a process for forming void-free epitaxial CoSi2 layer compatible with ultra shallow junctions according to the present invention.

Referring to FIG. 1, the present invention begins by providing a patterned silicon structure (11). The patterned silicon structure (11) should be understood to possibly include a wafer or substrate comprising a semiconducting material such as monocrystaline silicon, or a like structure as is known in the arts such as a silicon on insulator (SOI) structure. Pattern silicon structure (11) should be understood to possibly further include one or more conducting and/or insulating layers formed over the substrate or the like and one or more active and/or passive devices formed on or over the substrate or like. The key attribute of the patterned silicon structure (11) is that it has a non-planar silicon top layer in at least a portion of its area. Referring to FIG. 1, patterned silicon structure (11) can comprise a silicon substrate (12) having shallow trench isolation (STI) structures (13) therein and gate structures thereon between said STIs. Gate structures typically comprise an electrode layer (14) with a liner oxide layer (15) thereunder. Gate structures can further comprise lightly doped source/drain regions (LDD) (16) and sidewall spacers (17) as are known in the art.

Following formation of LDDs (16) and sidewall spacers (17), the patterned silicon structure (11) is cleaned using a dilute HF cleaning solution. The HF solution, which preferably has a concentration of between about 1% and 2%, is applied to the patterned silicon structure (11) for between about 7 to 8 minutes, resulting in slight lateral under-etch in the liner oxide layer (15).

Figure 2:
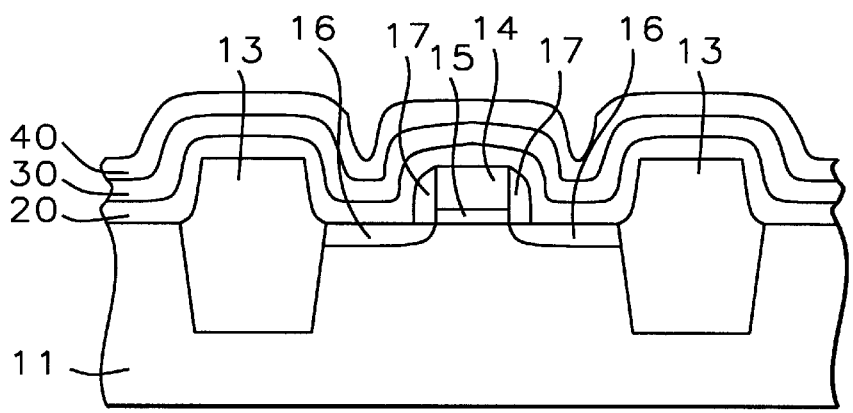

Referring to FIG. 2, a first titanium layer (20) is formed on the patterned silicon structure (11). The first titanium layer (20) is preferably deposited to a thickness of between about 50 angstroms and 80 angstroms using a sputtering process.

A cobalt layer (30) is formed on the first titanium layer (20). The cobalt layer (30) is preferably deposited to a thickness of between about 100 angstroms to 150 angstroms using a sputtering process. The cobalt deposition is preferably performed in-situ (in the same deposition chamber as the titanium deposition).

Still referring to FIG. 2, a second titanium layer (40) is formed on the cobalt layer (30). The second titanium layer (40) is preferably deposited to a thickness of between about 80 angstroms to 150 angstroms using a sputtering process. The second titanium deposition is preferably performed in-situ. A key advantage of the second titanium layer is that it prevents contamination of the cobalt layer by trace elements and contaminants in the ambient.

Figure 3:
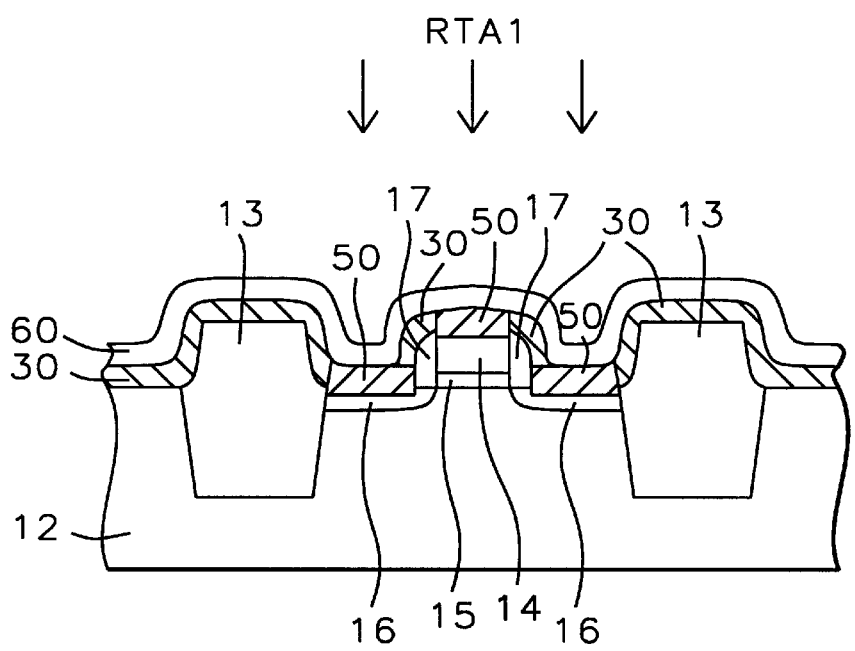

Referring to FIG. 3, the pattern silicon structure (11) is annealed using a first annealing step. The first annealing step is preferably a rapid thermal anneal (RTA) performed at a temperature of between about 550° C. and 580° C. for a duration of between about 45 to 90 seconds in a nitrogen ambient at atmospheric pressure. The first anneal step causes the cobalt to migrate downward and react with the silicon structure (11) to form a $CoSi_2$/CoSi (50) layer. The titanium in the first titanium layer migrates upward and the first titanium layer and the second titanium layer react with the nitrogen ambient to form TiN (60). A key feature of the present invention is that the thickness of the $CoSi_2$/CoSi (50) layer can be precisely controlled, which prevents stress induced voids in the silicon substrate at STI and sidewall spacer edges. Also, less silicon is consumed than in prior art cobalt silicide processes. Another key advantage of the present invention is that, due to the HF clean, no titanium silicide is formed between the $CoSi_2$/CoSi layer (50) and the silicon structure (11).

The $CoSi_2$/CoSi layer (50) comprises a $CoSi_2$ seed layer, whose thickness is dependent upon the temperature and duration of the first RTA process. The temperature and duration of the first RTA process are critical, as this $CoSi_2$ seed layer essentially acts as a template for transformation of the remaining CoSi in the $CoSi_2$/CoSi layer 50 to $CoSi_2$ during the second RTA. Also the first RTA process temperature prevents interaction between the first titanium layer (20) and the silicon in the silicon structure (11).

Figure 4:
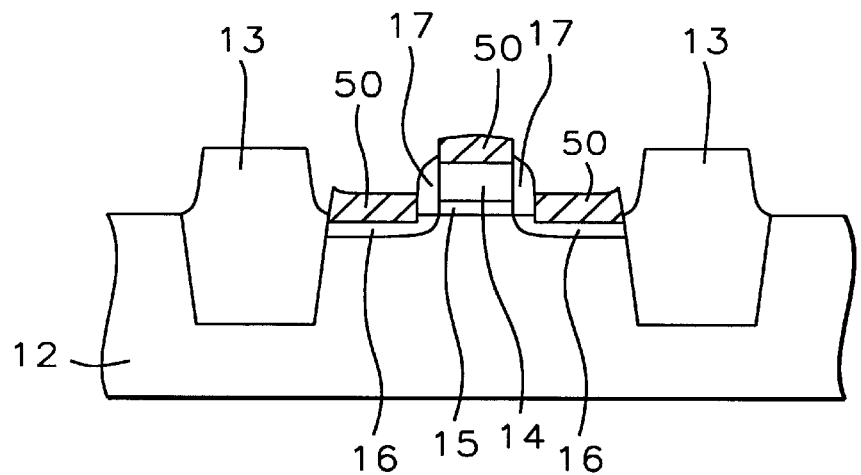

Referring to FIG. 4, the TiN (60) and unreacted cobalt (30) are removed using a selective etchback process. First an ammonium peroxide mixture (APM) clean is performed for between about 3 minutes and 8 minutes, preferably about 5 minutes. Next, a sulfuric peroxide mixture (SPM) clean is performed for between about 3 minutes and 8 minutes, preferably about 5 minutes. Finally, an APM dip is performed for between about 3 minutes and 5 minutes, preferably about 4 minutes. A spray clean method can be applied. The last APM dip is used to remove any TiSix or oxide phases on the dielectric spacers and field isolation, minimizing gate-to-source/drain leakage or bridging and increasing yield.

Still referring to FIG. 4, a second annealing step is performed on the silicon structure (11). The second annealing step is preferably a RTA, at a temperature of between about 825° C. and 875° C., preferably about 850° C., for a duration of between about 30 to 45 seconds. The second annealing step converts the remaining CoSi in the $CoSi_2$/CoSi layer (50) to $CoSi_2$, forming a $CoSi_2$ layer (50A).

This process results in highly uniform silicide with no grain-boundary induced silicide asperity (roughness) at the junctions. This is highly advantageous for future sub-0.1 micron CMOS technology when the junction depth is less that 800 angstroms. To minimize Si consumption, an ultra-thin but highly-uniform epitaxial silicide formed in this manner would result in relatively less Si consumption i.e. <300 angstroms, with no degradation in thermal stability (in excess of 950° C. for RTA and 750° C. for furnace anneal).

Preferred Embodiment

In a preferred embodiment of the present invention, a $CoSi_2$ layer (50A) formed as described above is used as a silicide as dopant source (SADS) layer.

Figure 5:
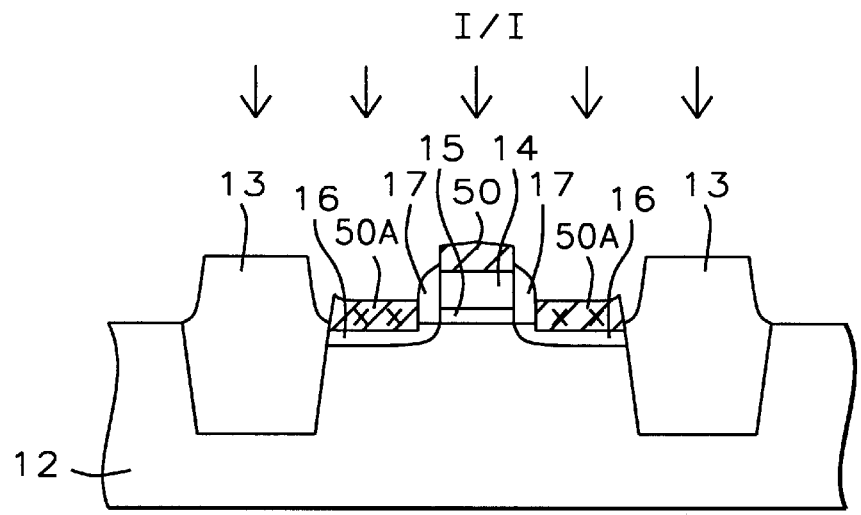
FIGS. 5 and 6 illustrate sequential sectional views of a preferred embodiment of the present invention, using a void-free epitaxial $CoSi_2$ layer formed according to the present invention as a silicide-as-dopant-source (SADS) to form ultra-shallow source/drain junctions with a diffusion process.

Referring to FIG. 5, impurity ions of a desired type (e.g. P or As for N+, and B for P+) are implanted into the $CoSi_2$ layer using a minimum energy, such that the peak implant profile is within the $CoSi_2$ layer, to prevent damage to the underlying silicon. For, example, for a $CoSi_2$ layer of between 250 angstroms and 300 angstroms, P ions would be implanted at an energy of between about 2 KeV and 10 KeV at a dose of between about 1E15 atm/$cm^2$ and 3E15 atm/$cm^2$. For a $CoSi_2$ layer of between 250 angstroms and 300 angstroms, B ions would be implanted at an energy of between about 0.2 KeV and 1.0 KeV at a dose of between about 1E15 atm/$cm^2$ and 3E15 atm/$cm^2$.

Figure 6:
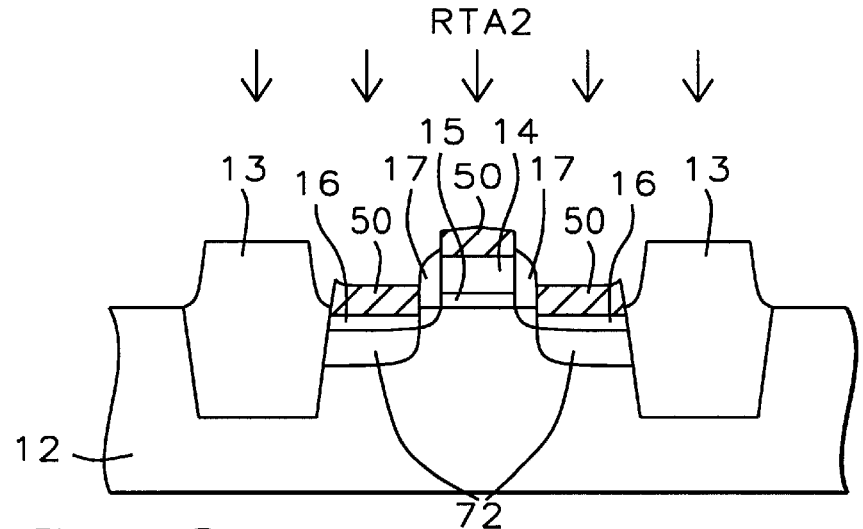

Referring to FIG. 6, the impurity ions are diffused into the underlying silicon to form ultra-shallow source/drain regions (72) using a thermal anneal processes. For an epitaxial $CoSi_2$ layer having a thickness of between about 250 angstroms and 300 angstroms, an anneal is performed at a temperature of between about 875° C. and 925° C., preferably about 900° C. for a time of between about 15 seconds and 45 seconds, preferably about 30 seconds. An ultra-shallow junction (72) of less than 800 angstroms is formed beneath the $CoSi_2$/Si interface.

Figure 7:
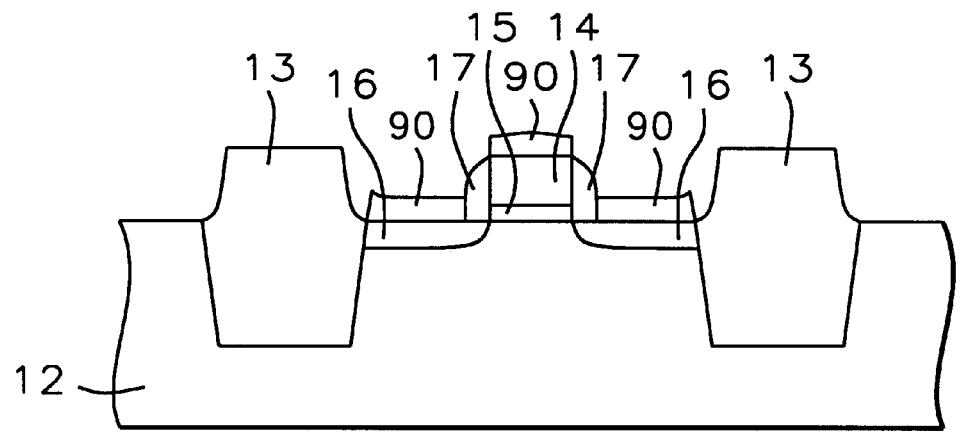
FIGS. 7 and 8 illustrate sequential sectional views of an method for forming a void-free epitaxial $CoSi_2$ according to the present invention wherein an optional selective epitaxial growth silicon layer is formed over a gate structure and a source and drain region having a thickness equal to the silicon consumed by the silicide process.

Referring to FIG. 7, an optional selective-epitaxial growth process can be used to deposit epitaxial silicon (90) on a polysilicon gate electrode (14) and source/drain regions (16), prior to silicidation. The thickness of the selective epitaxial growth silicon (SEG-Si) can be controlled to be just sufficient for the silicon consumed during the epitaxial silicide formation process (e.g. 250–300 angstroms). A HF vapor process is used for the surface clean prior to the SEG-Si process in place of a high-temperature $H_2$ bake to minimize dopant redistribution in the already-formed junction regions. This structure is especially advantageous for ultra-thin undoped-SOI devices due to the better fan-out in the source/drain, which reduces the problematic increase in parasitic resistance associated with this architecture.

Figure 8:
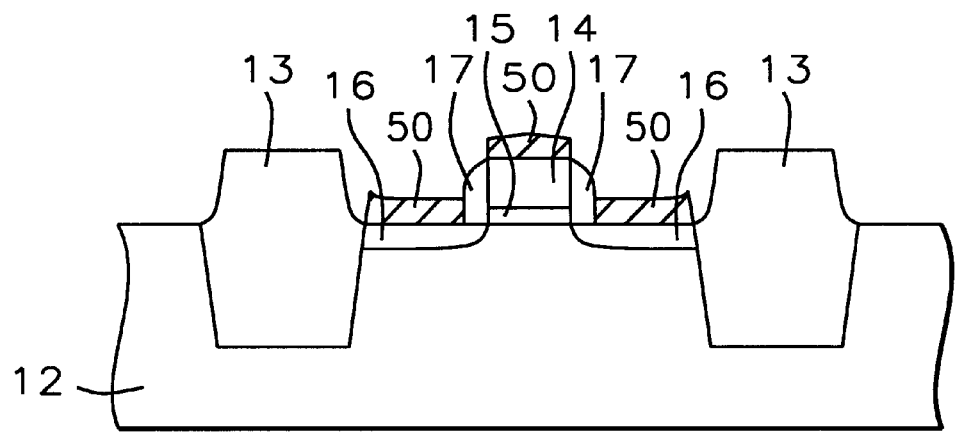

As shown in FIG. 8, the silicidation process as described above, forms the $CoSi_2$ layer (50) using the SEG-Si without consuming any of the underlying silicon in the source/drain regions (16) or the polysilicon gate electrode (14).

The invention provides a void-free epitaxial CoSi2 layer on patterned substrates (patterned silicon structure). The invention provides a method which is robust with low sensitivity to the thickness of the interfacial titanium ( first titanium layer). The invention further provides high throughput and ease of integration.

While the invention has been particularly shown and described with reference to the preferred embodiments thereof, it will be understood by those skilled in the art that various changes in form and details may be made without departing from the spirit and scope of the invention.

What is claimed is:

1. A method for forming a void-free epitaxial cobalt silicide ($CoSi_2$) layer on an ultra-shallow source/drain junction, comprising the steps of:

a) providing a patterned silicon structure;

b) forming a first titanium layer on said silicon structure;

c) forming a cobalt layer on said first titanium layer;

d) forming a second titanium layer on said cobalt layer;

e) annealing said silicon structure at a temperature of between about 550° C. and 580 °C. in a nitrogen ambient at atmospheric pressure; whereby said cobalt migrates downward and reacts with said silicon structure to form a $CoSi_2$/CoSi layer comprising a $CoSi_2$ seed layer on the surface of the silicon structure, and said first titanium layer migrates upward and said first titanium layer and said second titanium layer react with said nitrogen ambient to form TiN;

f) removing said TiN and unreacted cobalt; and g) annealing said silicon structure at a temperature of between about 825° C. and 875° C. to convert the $CoSi_2$/CoSi layer to a $CoSi_2$ layer.

2. The method of claim 1 which further includes, prior to step b, cleaning said patterned silicon structure using HF.

3. The method of claim 2 which further includes, subsequent to HF cleaning and prior to forming said first epitaxial layer, forming a selective epitaxial growth silicon layer over source and drain regions and polysilicon gate electrode, having a thickness approximately equal to the thickness of silicon consumed by forming the $CoSi_2$ layer.

4. The method of claim 1 wherein said first titanium layer is formed to a thickness of between about 50 angstroms and 80 angstroms, said cobalt layer is formed to a thickness of between about 100 angstroms and 150 angstroms, and said second titanium layer is formed to a thickness of between about 80 angstroms and 150 angstroms.

5. The method of claim 1 wherein the anneal in step e is a rapid thermal anneal performed for a duration of between about 45 seconds and 90 seconds, and the second anneal, and the anneal in step g is a rapid thermal anneal performed for a duration of between about 30 seconds and 45 seconds.

6. The method of claim 1 wherein said patterned silicon structure is cleaned using HF vapor at a concentration of between about 0.5% and 2% for a duration of between about 7 minutes and 8 minutes.

7. The method of claim 1 wherein said $CoSi_2$ layer has a thickness of between about 150 angstroms and 300 angstroms.

8. A method for forming a void-free epitaxial cobalt silicide ($CoSi_2$) layer which is used as a silicide-as-dopant-source to form an ultra-shallow source/drain junction, comprising the steps of:

a) providing a patterned silicon structure;

b) cleaning said patterned silicon structure using HF;

c) forming a first titanium layer on said silicon structure;

d) forming a cobalt layer on said first titanium layer;

e) forming a second titanium layer on said cobalt layer;

f) annealing said silicon structure using a rapid thermal anneal at a temperature of between about 550° C. and 580° C. in a nitrogen ambient at atmospheric pressure; whereby said cobalt migrates downward and reacts with said silicon structure to form a $CoSi_2$/CoSo layer, and said first titanium layer migrates upward and said first titanium layer and said second titanium layer react with said nitrigen ambient to form TiN;

g) removing said TiN and unreacted cobalt; and h) annealing said silicon structure using a rapid thermal anneal at a temperature of between about 825° C. and 875° C. to convert said $CoSi_2$/CoSi layer to a $CoSi_2$ layer;

i) implanting impurity ions into said $CoSi_2$ layer such that the peak dopant profile is within the $CoSi_2$ layer; and j) annealing said patterned silicon structure to diffuse said dopant ions into said patterned silicon structure to form ultra-shallow junctions.

9. The method of claim 8 which further includes, subsequent to step b and prior prior to step c, forming a selective epitaxial growth silicon layer over source and drain regions and polysilicon gate electrode, having a thickness approximately equal to the thickness of silicon consumed by forming the $CoSi_2$ layer.

10. The method of claim 8 wherein said first titanium layer is formed to a thickness of between about 50 angstroms and 80 angstroms, said cobalt layer is formed to a thickness of between about 100 angstroms and 150 angstroms, and said second titanium layer is formed to a thickness of between about 80 angstroms and 150 angstroms.

11. The method of claim 8 wherein the anneal in step f is performed for a duration of between about 45 seconds and 90 seconds, and the anneal in step h is performed for a duration of between about 30 seconds and 45 seconds.

12. The method of claim 8 wherein said patterned silicon structure (11) is cleaned using HF vapor at a concentration of between about 0.5% and 2% for a duration of between about 7 minutes and 8 minutes.

13. The method of claim 8 wherein said $CoSi_2$ layer has a thickness of between about 250 angstroms and 300 angstroms.

14. The method of claim 9 wherein said $CoSi_2$ layer has a thickness of between about 250 angstroms and 300 angstroms.

15. The method of claim 14 wherein the anneal in step j is performed at a temperature of between about 875° C. and 925° C. for a duration of between about 20 seconds and 40 seconds.

* * * * *

UNITED STATES PATENT AND TRADEMARK OFFICE
CERTIFICATE OF CORRECTION

PATENT NO.    : 6,410,429 B1
DATED         : June 25, 2002
INVENTOR(S)   : Chaw Sing Ho et al.

It is certified that error appears in the above-identified patent and that said Letters Patent is hereby corrected as shown below:

<u>Title page,</u>
Item [75], please delete "Kheng Chok Tee, Port Klane (MY)", and replace with
-- Kheng Chok Tee, Port Klang (MY) --. Please delete "Alex Kalhung See" and replace with -- Alex Kai Hung See --.
Item [74], please delete "William J. Stuffel", and replace with -- William J. Stoffel --.

Signed and Sealed this

Fourth Day of January, 2003

JAMES E. ROGAN
*Director of the United States Patent and Trademark Office*